(12) United States Patent
Funk et al.

(10) Patent No.: US 6,524,923 B2
(45) Date of Patent: Feb. 25, 2003

(54) INTEGRATED ADJUSTABLE CAPACITOR

(75) Inventors: Karsten Funk, Mountain View, CA (US); Markus Lutz, Sunnyvale, CA (US); Detlef Clawin, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/145,020

(22) Filed: May 14, 2002

(65) Prior Publication Data

US 2002/0135047 A1 Sep. 26, 2002

Related U.S. Application Data

(62) Division of application No. 09/659,932, filed on Sep. 12, 2000, now Pat. No. 6,448,604.

(51) Int. Cl.[7] .............................................. H01L 21/20
(52) U.S. Cl. ........................ 438/379; 438/50; 438/53; 257/312; 257/386; 257/532; 257/535; 257/536
(58) Field of Search ................................. 257/312, 319, 257/386, 415, 419, 532, 535, 536, 537, 538; 438/379, 50, 53

(56) References Cited

U.S. PATENT DOCUMENTS

| 6,177,716 | B1 | * | 1/2001 | Clark | 257/532 |
| 6,328,697 | B1 | * | 12/2001 | Fraser | 438/50 |
| 6,388,299 | B1 | * | 5/2002 | Kang et al. | 257/415 |
| 6,443,901 | B1 | * | 9/2002 | Fraser | 438/50 |

* cited by examiner

Primary Examiner—David Nelms
Assistant Examiner—Andy Huynh
(74) Attorney, Agent, or Firm—Kenyon & Kenyon

(57) ABSTRACT

An integrated adjustable capacitor device and method for making such a device are provided. The adjustable capacitor includes an underlying electrode, a dielectric cavity, an upper electrode, and an etch cavity for removing sacrificial material from the dielectric cavity. The surface of the device is relatively flat due to epitaxal deposition of epi polysilicon and single crystal silicon. The adjustable capacitor system is capable of undergoing CMOS processes without requiring additional steps of covering the capacitor device to protect it and then removing the covering following the CMOS processes.

3 Claims, 6 Drawing Sheets

INTEGRATED ADJUSTABLE CAPACITOR

This is a division of application Ser. No. 09/659,932, filed Sep. 12, 2000, now U.S. Pat. No. 6,448,604.

BACKGROUND INFORMATION

The present invention relates to an integrated capacitor and a method for manufacturing an integrated capacitor. More specifically, a mechanically-adjustable capacitor is provided on a structure which may also include devices created by a complementary metal oxide semiconductor ("CMOS") process. Micro-machined capacitors have been developed as part of micro-electro-mechanical systems. Using similar technologies to those used to manufacture semiconductors, microscopic capacitors may be fabricated on silicon wafers. These technologies may include oxidation of a substrate, application of a photoresist material, selective exposure to light or x-rays through a mask, and etching to build devices in layers on a substrate.

Although similar techniques are used for creating integrated circuits ("ICs")and micro-electro-mechanical devices ("MEMs"), when both ICs and MEMs are constructed on the same substrate, elements of these processes can interfere with each other. For example, polishing and etching processes used in the manufacture of ICs may damage MEMs that have already been created on a silicon wafer. In addition, subjecting certain MEMs to high temperatures used for processing and building MEMs can damage or destroy the CMOS. Cutting or "dicing" of a silicon wafer can also damage MEMs as stray particles can destroy a MEMs structure.

One solution for protecting a MEM during circuit creation and wafer processing has been to cover the MEM device with a protective layer (e.g., a layer of silicon oxide) during the processing stages in which the circuitry is created and the wafer is diced. This protective layer must later be removed in a time-consuming process. Furthermore, it is difficult to remove the protective layer without damaging the electronics components, and therefore the types of electronics that can be developed are limited.

Whether MEMs are developed first on a wafer and ICs are later developed, or the other way around, adding and later removing a protective covering for the first-developed components is generally required. These extra steps add time and expense to the process. Furthermore, in prior art processes, adding protective layers to cover components may be required to make the surface of the wafer approximately flat so that other operations such as etching and lithography may be performed.

These limitations have restricted the development of devices that include both MEMs and ICs. Such devices may include, for example, an adjustable capacitor and supporting circuitry that may, for example, be adapted to operate in a high-frequency antenna. When high-frequency antennas are adjusted to receive a certain frequency, the impedance of the antenna may be adjusted to reduce signal reflections. The impedance may be adjusted, for example, via adjusting the capacitance of an adjustable capacitor attached to the antenna. An adjustable capacitor can be used to compensate for the parasitic capacitance of the antenna circuitry.

Adjustable capacitors may be used to adjust antenna impedance, but integrated adjustable capacitors used for this application suffer from the manufacturing problems described above. Therefore, semiconductor diodes are frequently used for this application. Semiconductor diodes have a drawback that there is a large capacitance in the material of which they are constructed, thereby introducing a noise source into the system. An integrated adjustable capacitor that can be more easily manufactured on the same substrate as electronic circuits would be helpful for this application as well as several others, such as exact electrical filter, capacitor switches for radio frequency (RF) applications.

DETAILED DESCRIPTION

Figure 1A:
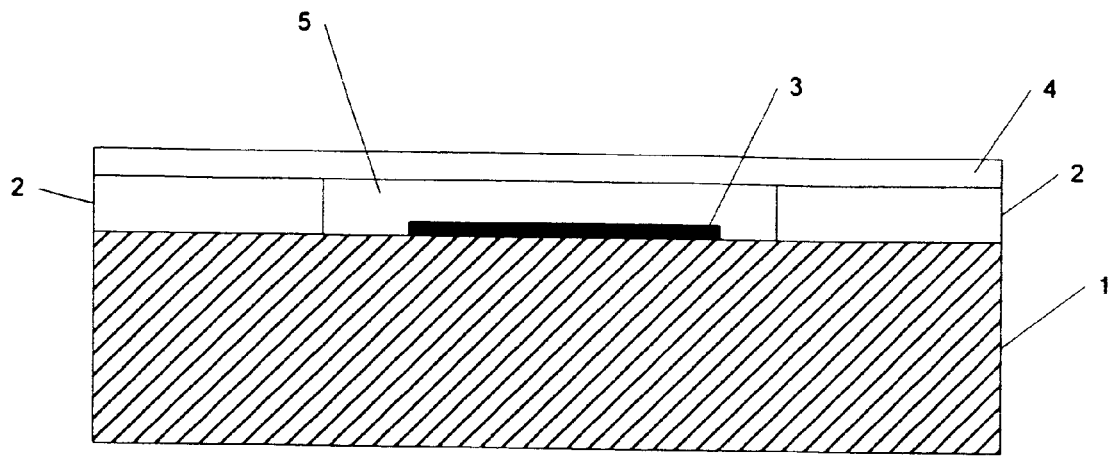
FIG. 1a shows a schematic diagram of an integrated adjustable capacitor device with an upper electrode in an un-deflected position.
Figure 1B:
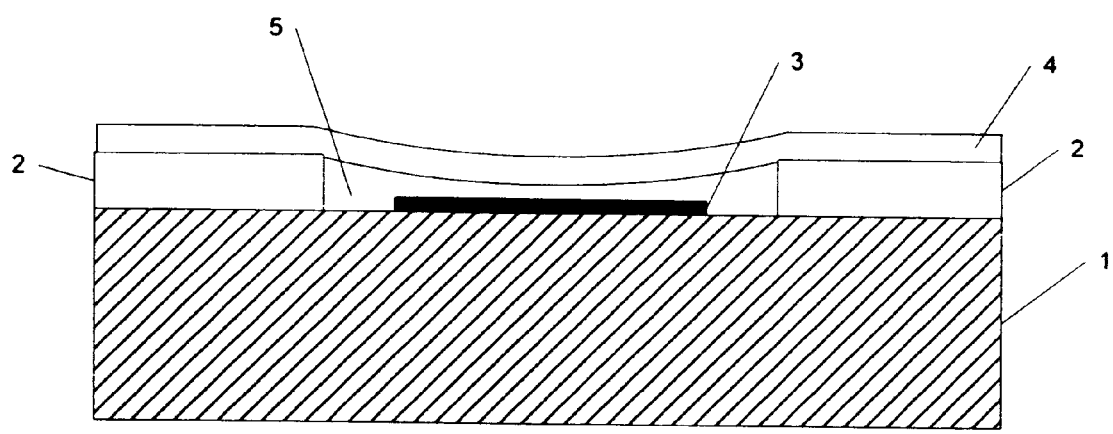
FIG. 1b shows a schematic diagram of an integrated adjustable capacitor device with an upper electrode in a deflected position.

FIG. 1a shows an integrated adjustable capacitor of the type that may be used in the present invention. The capacitor is formed on a substrate 1, for example a silicon wafer. An insulator 2 may support a upper electrode 4 above an electrode 3. The insulator 2 may comprise, for example, silicon dioxide and the upper electrode 4 may comprise, for example, polysilicon or other conducting material. The electrode is comprised of a conductor, for example, a semiconductor such as doped silicon, or a metal such as tungsten. Tungsten has a higher conductivity compared to doped silicon, which leads to a high "Q" value (representing the ratio of resistance to reactance). The conductor may be deposited on top of the substrate, or it may comprise an area of the substrate that is doped to become electrically conductive. When a direct current voltage is applied to the electrode 3, the upper electrode 4 will deflect as shown in FIG. 1b, thereby changing the capacitance between the electrode 3 and the upper electrode 4. A cavity 5 between the electrode 3 and the upper electrode 4 functions as a dielectric for the capacitor. The cavity 5 may be filled with, for example, air or another gas, or it may be a vacuum. In this way, a micro-electro-mechanical adjustable capacitor may be provided for a system such as a high-frequency antenna.

Figure 2:
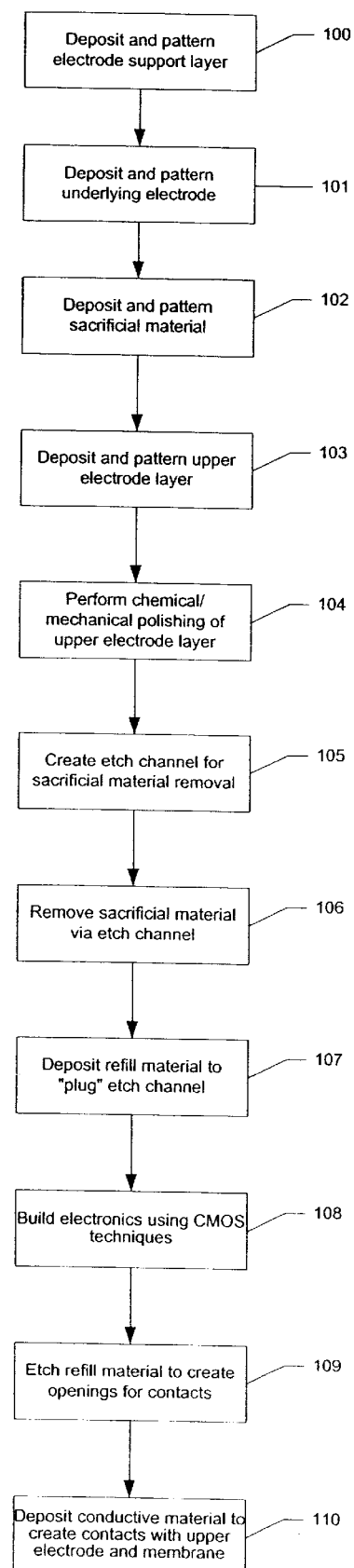
FIG. 2 shows a flow chart of a process for manufacturing an integrated adjustable capacitor system, according to an embodiment of the present invention.

In one embodiment of the present invention, an integrated adjustable capacitor is provided on a substrate together with integrated circuitry developed to operate with the capacitor. The integrated circuitry may be created using, for example, standard CMOS processes. FIG. 2 shows a flow chart of the steps employed in a method for making an integrated adjustable capacitor, according to an embodiment of the present invention. As shown in FIG. 2, in step 100, a support layer for an electrode is developed or deposited on a substrate, such as a silicon wafer. This support layer may comprise, for example, a layer of silicon dioxide, which may be deposited or reacted from the silicon wafer, according to known techniques such as thermal oxidation or plasma deposition. The support layer is then patterned to create the desired structure.

The patterning and etching may be performed according to any number of known techniques such as by coating the surface with a photoresist material, exposing portions of the photoresist to light, x-rays, or other such energy according to the pattern of a mask. Portions of the photoresist and the underlying layer may then be etched away using known techniques such as chemical or plasma etching. After the electrode support is created, an electrode may be created in step 101 by, for example, depositing a conductor on top of the support layer created in step 100. The electrode may be comprised of a semiconductor material, or a metal. In one embodiment of the invention, the electrode is comprised of tungsten. Tungsten has both good conductivity and a high melting point and can therefore withstand high temperatures associated with CMOS processes. The electrode material may be deposited and patterned using known processes such as vapor deposition or sputtering. After the electrode is created in step 101, a sacrificial material is added on top of the electrode in step 102. The sacrificial material may comprise, for example, silicon dioxide. The sacrificial material may be deposited and patterned according to known techniques, as described above.

Figure 3:
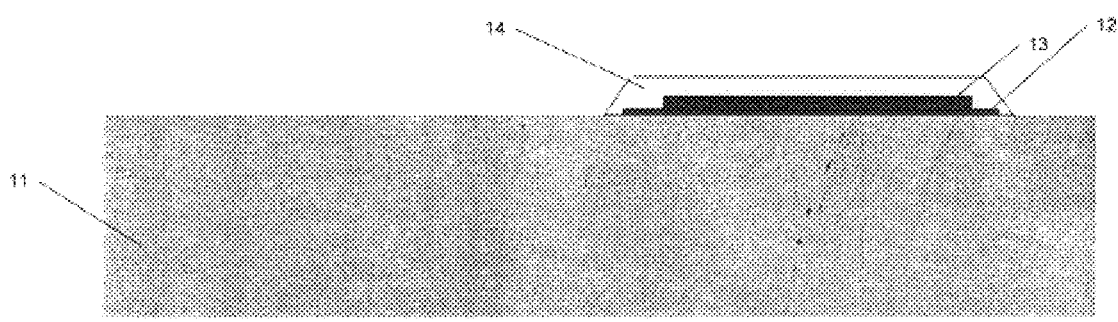
FIG. 3 shows a schematic diagram of an integrated adjustable capacitor system following the deposition of a sacrificial material.

FIG. 3 shows an embodiment of the integrated capacitor system after the steps 100 to 102 of FIG. 2 have been performed. A substrate 11 is shown, with an electrode support layer 12 and an underlying ("buried") electrode 13 having been deposited and patterned. A sacrificial material 14 is shown deposited over the electrode 13 and electrode support 12.

Returning to FIG. 2, in step 103 a upper electrode layer is deposited over the sacrificial material. The upper electrode layer is the layer that is deflected to adjust the capacitance of the device. The upper electrode layer may be created, for example, by depositing a layer of start polysilicon used as a seed for the following growth of poly silicon over the sacrificial layer. This start polysilicon may be grown or deposited and patterned according to known techniques, as described above. The start polysilicon layer may be deposited in order to create the proper conditions for growing a layer of epi poly over it. Epi poly (epitaxial polysilicon) is a poly silicon grown in an epitaxial reactor. This process allows an in situ growth of poly and single crystalline silicon. The silicon will grow in single crystalline form on areas where the start poly has been previously removed.

Figure 4:
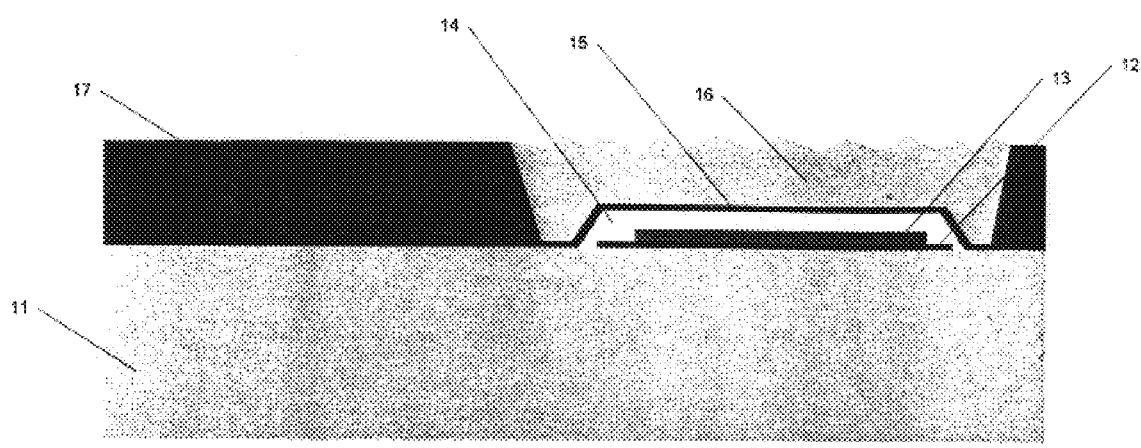
FIG. 4 shows a schematic diagram of an integrated adjustable capacitor system following the deposition of an upper electrode layer.

FIG. 4 shows an embodiment of the integrated adjustable capacitor following step 103. A start polysilicon layer 15 is shown over the sacrificial material 14. An epi poly layer 16 is shown on top of the start polysilicon layer 15. Single crystal silicon 17 is shown filling in the layer corresponding to the epi poly layer. In this manner, a roughly flat top level of the device is maintained through the process.

Returning to FIG. 2, in step 104, chemical/mechanical polishing of the upper electrode layer is performed. This chemical/mechanical polishing may be performed to prepare the surface of the epi poly/single crystal silicon layer for CMOS processes used to further develop the integrated capacitor device. This chemical/mechanical polishing may be performed, for example, according to known techniques. In step 105, an etch channel for removal of the sacrificial material is created. The etch channel is a channel etched through the upper electrode layer to provide access to the sacrificial material. The etch channel may be created, for example, using a known deep reactive ion etching technique. Deep reactive ion etching may be performed, for example, by using a plasma to selectively etch a hole or trench through the upper electrode layer. This technique may also be used, for example, to create insulation gaps (e.g., for electrically defining and insulating components of the device).

In step 106 of FIG. 2, the sacrificial layer is removed by allowing a removal chemical or plasma such as hydrofluoric acid (HF) to flow through the etch channel to the sacrificial layer. He etch reactants are carried away in the resulting solution or as a gas. In step 107, a re-fill material is deposited to plug the etch channel and the insulation gaps. The refill material may comprise, for example, silicon dioxide, which acts as an insulator. The insulation material may be deposited, for example, via anisotropic deposition, which deposits the oxide on a wafer surface and in the etch channels without allowing the oxide to flow into gaps where it is not wanted (e.g., the space left by the removal of the sacrificial material).

Figure 5:
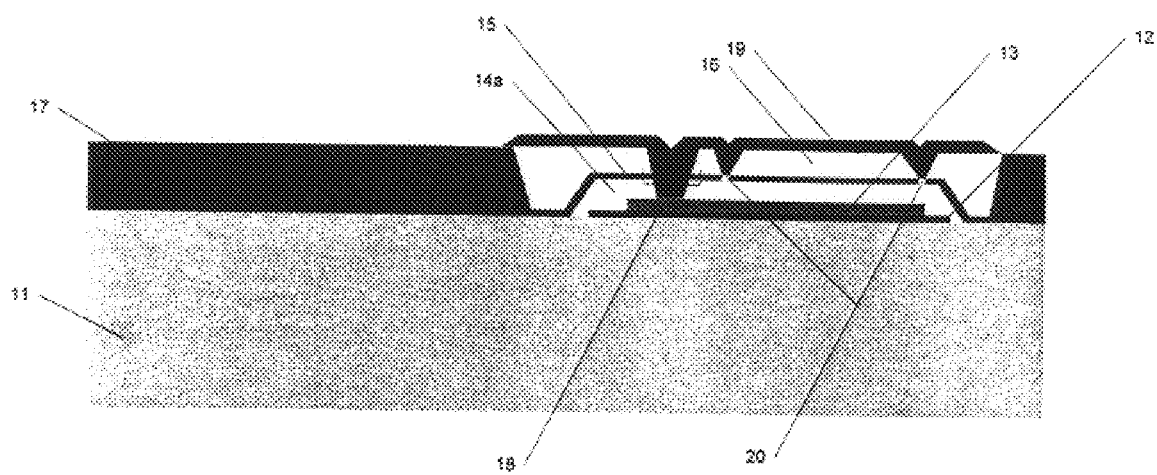
FIG. 5 shows a schematic diagram of an integrated adjustable capacitor system following the deposition of a refill material.

FIG. 5 shows an embodiment of the integrated adjustable capacitor following step 107. The sacrificial material 14 has been removed, leaving a dielectric cavity 14a. This dielectric cavity 14a may function as a dielectric between the electrodes of the variable capacitor, and may be filled with air or other gas, or it may be a vacuum. An etch channel 18 and insulation channels 20 are shown through the upper electrode layer, and filled in with a refill material 19.

Returning to FIG. 2, in step 108, electronics may be added to the integrated capacitor device using, for example standard CMOS processes to create transistors, logic gates, and other integrated components as well as connecting circuitry. In step 109, these techniques may also be used to etch the refill material to build contacts to electrically connect the adjustable capacitor. In step 110, conductive material (e.g., aluminum) may be added to create electrical contacts. These electrical contacts may include contacts to the underlying electrode, and to the upper electrode layer, and may connect these components to other integrated components and circuitry on the device.

Figure 6:
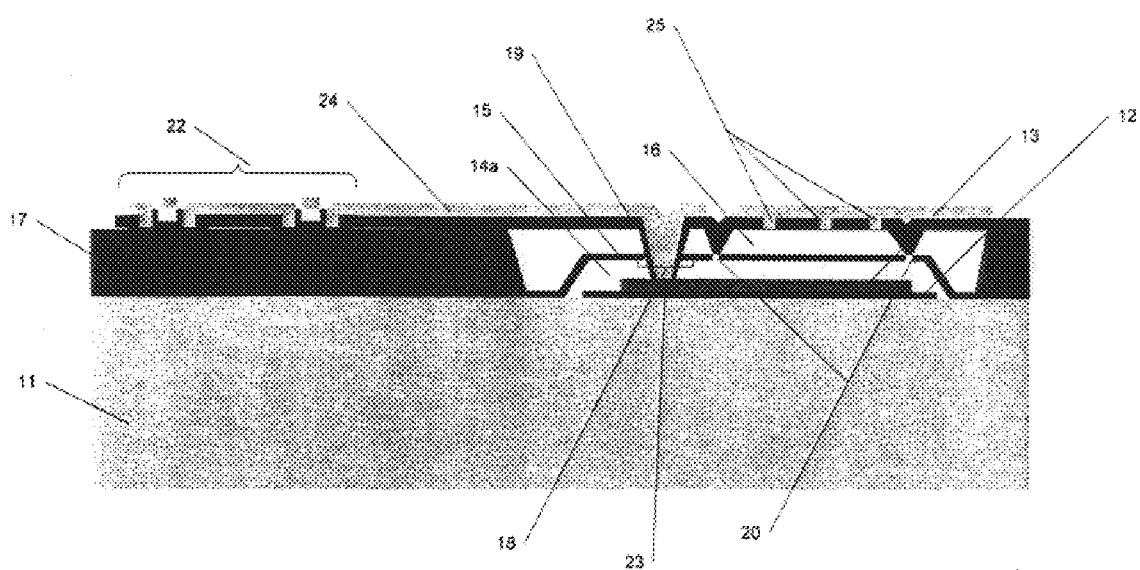
FIG. 6 shows a schematic diagram of an integrated adjustable capacitor system following the deposition of an electrical contact material and the creation of electronic components.

FIG. 6 shows an embodiment of an integrated adjustable capacitor device following step 110. In this embodiment, an aluminum contact layer 24 is shown contacting the underlying electrode at a contact point 23. In this embodiment, aluminum can be used because the upper electrode layer is thicker than those found in prior art systems, due to the use of the epitaxal process for deposition of the upper electrode layer 16. Upper electrode contacts 25, also formed by the aluminum layer, are shown in this embodiment as made by several contact points 25. By using multiple contact points, lower resistance can be achieved. Also shown in FIG. 6 are electronic components 22 created, for example, with a CMOS process.

While prior art systems use primarily polysilicon to construct electrodes and other components of an adjustable capacitor system, one embodiment of the present invention includes electrodes made of tungsten (lower) and epi poly (upper level). By using these materials, resistance can be lowered to a desired level and the expense of the device can be lowered, since the device is less susceptible to heat, and therefore can withstand the CMOS processes (e.g., high heat). Furthermore, by providing a relatively flat top surface, rather than a stepped surface, CMOS processes can be employed because etching and lithography steps will not interfere with elements on different levels.

An integrated adjustable capacitor device such as that described above can be used in a high frequency antenna. The capacitor can be adjusted in order to adjust the impedance of the antenna to match the frequency to which the antenna is tuned. An antenna for receiving signals (e.g., radio frequency signals) includes an inductance and a natural parasitic capacitance present in the material of which the antenna is constructed. By including an adjustable capacitor device in an antenna, the parasitic capacitance and resulting phase shifts (due to imaginary power effects) can be compensated for by adjusting the capacitance of the adjustable capacitor. In this manner, the receiver sensitivity can be increased by adjusting the impedance match between the antenna and, for example, a low noise amplifier to which it is connected.

By using a variable capacitor device, some of the problems of using variable capacitance diodes can be avoided, such as the non-linearities and losses characteristic of these diodes. In an embodiment of an adjustable integrated capacitor device as described above, because the conductive paths between the capacitor element and the electronic circuit elements are short, and there are no bonds required between the structures, parasitics are reduced. In an embodiment of an antenna employing an integrated adjustable capacitor, only one chip has to be mounted on the antenna, thereby reducing costs over prior systems.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. A method for manufacturing an integrated adjustable capacitor comprising the steps of:

depositing and patterning an underlying electrode on a substrate;

depositing and patterning a sacrificial material over the underlying electrode;

depositing and patterning an upper electrode layer over the sacrificial material;

creating an etch channel through the upper electrode layer;

removing the sacrificial material via the etch channel; and depositing a refill material to plug the etch channel.

2. The method of claim 1, further comprising the step of:

building electronics using CMOS techniques.

3. The method of claim 1, further comprising the steps of:

etching the refill material to create an opening for a contact to the underlying electrode; and depositing conductive material to create an electrical contact with the underlying layer.

* * * * *